United States Patent Office 3,395,014

Patented July 30, 1968

3,395,014

PREPARATION OF PRINTING PLATES BY HEAT PLUS A PRESSURE GRADIENT

Abraham Bernard Cohen, Springfield, and Vincent Joseph Webers, Red Bank, N.J., assignors to E. I. du Pont de Nemours and Company, Wilmington, Del., a corporation of Delaware No Drawing. Filed June 7, 1963, Ser. No. 286,180
12 Claims. (Cl. 96—28)

This invention relates to a process for preparing relief images suitable for direct use as printing plates and, more particularly, to a process for preparing such relief images employing a photohardening step. The invention further relates to a photo-sensitive element suitable for use in such a process.

By "photohardening" is meant, in general, the changes in various physical properties of certain photosensitive materials on exposure to actinic radiation. There will usually be an increase in hardness and tensile strength, or viscosity, a lowering of swelling, solubility or sensitivity to solvent attack, and of particular interest in the present case, an increase in the melting point or flow temperature. Photohardening is usually accomplished by photochemical reactions in which new chemical bonds are formed, that is through photopolymerization and photocrosslinking reactions.

Solid compositions capable of photopolymerization to rigid, insoluble, tough, structures are useful in making printing plates and are described in U.S. Patent 2,791,-504. Printing plates with uniform printing height can be produced directly by exposing to actinic light, through an image-bearing process transparency, a photopolymerizable layer coated on a suitable support, until substantially complete polymerization of the composition occurs in the exposed areas with substantially no polymerization in the nonexposed areas. Portions of the layer in the latter areas are generally removed by treatment with a suitable solvent in which the polymerized composition in the exposed areas is insoluble leaving a relief image of the text of the transparency suitable for direct use as a printing plate, especially for letter press work or dry off-set. This operation is called "development." Solvent development is inherently a wet operation and when organic solvents are used there are toxicity and flammability problems which usually involve additional hazards and equipment.

In assignee's copending application, Cohen and Webers, Ser. No. 205,566, filed June 27, 1962, now Patent No. 3,264,103, there is disclosed a completely dry process for developing the relief image. The present invention is related to that of the above Cohen and Webers application but exhibits some advantages thereover. In the present invention a fluid pressure gradient is used to exert a fairly uniform pressure across an exposed and heated photohardenable layer so that the flowable underexposed portions are forced through the open spaces of a porous material without putting an unduly high force on the non-flowable exposed portions. Also, using the process of this invention the underexposed portions may be forced through open spaces in structures wherein the entire photohardenable stratum lies within a porous support or is otherwise inaccessible to mechanical pressing. For these reasons the instant invention exhibits advantages and also permits the preparation of elements which could not be conveniently made by the techniques described above.

These advantages are attained in accordance with this invention by a process for preparing a printing element from a layer of a photohardenable thermoplastic stratum in contact with a porous support, which process comprises:

(1) Exposing said photohardenable stratum imagewise to actinic radiation, (2) Maintaining said stratum at an operating temperature intermediate between the flow temperatures of the exposed and the underexposed portions of said stratum, and (3) Applying a fluid pressure gradient across the element to remove said underexposed portions thereby producing an image in said stratum corresponding to the pattern of imagewise exposure.

The fluid pressure gradient is preferably gaseous and may be in either direction so that, where the thermoplastic stratum is coated as a separate stratum on the porous support, the unexposed material may flow either toward the porous support or be removed from the face opposite the porous support. Steps (2) and (3) may be performed simultaneously if desired.

In a preferred embodiment of this invention, the photohardenable stratum is a photopolymerizable stratum which will contain a polymeric binder, a polymerizable monomer and a photoinitiator each so selected and used in such proportions that the resulting startum will be solid below 40° C. The unexposed or underexposed parts of the stratum will become mobile at an elevated temperature by having a flow temperature above 40° C. and below 260° C. Imagewise exposure to actinic radiation results in polymerization, with an accompanying increase in flow temperature, in the exposed areas without substantial polymerization and increase in flow temperature in the underexposed, complementary, adjoining, image areas. Thus, by heating the exposed stratum to a temperature intermediate between the flow temperatures of the exposed and the underexposed materials, the underexposed (unpolymerized) molten material may be caused to flow selectively into the porous support by application of a pressure gradient across the element. In that embodiment wherein the thermoplastic photohardenable stratum is borne as a separate stratum upon the porous support the gaseous pressure gradient is achieved by applying the lower pressure to the side of the porous support opposite the thermoplastic stratum, causing the material of the stratum to be forced imagewise into the support with a relief image remaining in the stratum.

In another embodiment of this invention, the thermoplastic stratum is contained within the open spaces of the porous support so that the support and thermoplastic stratum are integral. In this latter embodiment, the gaseous pressure gradient may be oriented in either direction to produce, for example, a stencil which would be impermeable to printing in an exposed area but permeable in the underexposed areas after the pressure gradient has caused removal of the thermoplastic material from those areas of the porous support. The polymerized image remaining may be hardened further by a subsequent exposure to actinic radiation although this latter step is usually desirable only with certain compositions such as those with a higher ratio of polymerizable monomer to binder.

One solid photohardenable layer useful in this invention is formed from a photopolymerizable composition which comprises:

(1) An organic polymeric binder, 10 to 90 parts by weight, (2) An ethylenically unsaturated compound containing 1 or more terminal ethylenic groups, having a boiling point above 100° C. at normal atmospheric pressure and being capable of forming a high polymer by photoinitiated addition polymerization, 10 to 90 parts by weight, and (3) A free-radical generating addition polymerization initiator, activatable by radiation, 0.001 to 10.0 parts by weight.

In addition to the above constituents, the photopolymerizable layer can contain, if desired, (4) A thermal polymerization inhibitor, 0.001 to 6.0 parts by weight.

Components (1) and (2) can be combined as a single material serving the function of both monomer and polymer in which case the ethylenic unsaturation can be present as an extralinear substituent attached to a thermoplastic linear polymer, such as polyvinyl acetate/acrylate, cellulose acetate/acrylate, cellulose acetate/methacrylate, N-acrylyloxymethyl polyamide, etc.

The photohardenable composition may also contain a chain transfer agent or polymerization accelerator including one or more of the chain transfer agents disclosed in U.S. Patent 3,046,127, issued July 24, 1962, in the amounts given in that patent, especially a polyethylene glycol of a molecular weight of about 500 to about 20,000. Also, esters and ethers of such polyethylene glycols are useful.

The instant invention is not limited to particular photohardenable compositions and essentially any which meets the "flow" temperature requirements is useful. Suitable compositions which can be used are described in U.S. Patents 2,760,863 and 2,791,504. Other photopolymerizable compositions which can be used are described in the patents and U.S. applications of assignees as follows: N-methoxymethyl polyhexamethylene adipamide mixtures of Saner, British specification No. 826,272, issued September 23, 1959; linear polyamide compositions containing extralinear N-acrylyloxymethyl groups of U.S. Patent 2,972,540; polyvinylacetal compositions having the extralinear vinylidene groups of U.S. Patent 2,929,-710; polyester, polyacetal or mixed polyester acetal mixtures of U.S. Patent 2,892,716; the fusible blends of selected organic-soluble, base-soluble cellulose derivatives with addition-polymerizable components and photoinitiators of U.S. Patent 2,927,022; fusible polyvinyl alcohol derivatives of U.S. Patent 2,902,365; 1,3-butadiene compositions of McGraw, U.S. Patent 3,024,180.

The underexposed and, therefore, unhardened material of the photohardenable stratum is caused to flow in a molten form when the stratum, after the exposure, is heated to its operating temperature. The flow is directed by means of a pressure gradient which most often is achieved by having atmospheric pressure on one side of the element and a partial vacuum on the other side. The process is also operable under any other type of pressure gradient, e.g., with the high pressure side being above atmospheric while the low pressure side is at or below atmospheric, with both sides above atmospheric pressure, and with both sides below atmospheric pressure. The only requirement is an appreciable pressure difference between the two sides, preferably a difference of about 0.1 to 5.0 atmospheres. Optimum pressure differences may vary somewhat with the thickness of the thermoplastic stratum and its melt viscosity at the operating temperature. Differential pressures can be obtained by use of conventional pumping or evacuating systems. A vacuum printing frame in conjunction with infrared heating means is especially convenient for producing an image with minimum handling. Auxiliary devices may be useful, e.g., in Example I below, it is shown that image quality is improved by placing a rubber dam over the exposed element during application of the heat and the pressure gradient.

Improved results may be obtained by sealing the edges of the element so that gases causing the pressure gradients cannot enter or leave the porous support except through the opposite faces. With the edges of the element sealed, the process is operable with a smaller pressure gradient.

Felt has been found to give very satisfactory results as the material for the porous support. Other suitable porous supports are porous metal, clay plates, filter paper, nainsook cloth, other fabrics and papers, perforated metal, sintered glass, sheets of latex or polyurethane foam, etc. The porous support advantageously may be a combination of two or more separate elements such as a sheet of filter paper made more rigid by being supported on a wire screen. The preferred support will vary considerably according to the intended use of the element and the economic considerations involved.

The invention will be further illustrated by but is not intended to be limited to the following examples of preferred embodiments thereof wherein parts and percentages are by weight unless otherwise specified.

EXAMPLE I

A coating solution was prepared from 150 g. of a 30% solution in acetone of cellulose acetate butyrate, 40 g. of polyethylene glycol diacrylate and 25 ml. of a 1% solution of 2-ethyl-9,10-anthraquinone in acetone. The cellulose acetate butyrate contained ca. 13% acetyl groups, ca. 37% butyryl groups and had a viscosity of 64 to 124 poises as determined by A.S.T.M. Method D-1343-54T in solution described as Formula A, A.S.T.M. Method D-871-54T. The polyethylene glycol diacrylate was derived from polyethylene glycol with an average molecular weight of 300.

The composition was coated on an 0.001 inch-thick unsubbed polyethylene terephthalate film support and dried to give a coating thickness of about 0.011 inch.

A piece of white, pressed, cotton-wool felt 0.032 inch in thickness, having a weight of 6.62 ounces per square yard and a porosity (void fraction) of 0.79, was made black by painting it with a 5% dispersion of carbon black particles. The particle size of the carbon black was 9 millimicrons and the blackness index was 220. The dispersion was made up by mixing equal parts of a 10% suspension of carbon black in isopropyl alcohol with a 10% solution of the cellulose acetate butyrate described above in acetone. The blackened side of the felt was laminated, after drying, to the polymerizable coating prepared above by pressing the two strata together at about 80° C. The laminated element was then exposed through the polyethylene terephthalate film and through a photographic negative, to 8 screened passes in a vacuum printing frame (Fairchild Exposure Unit—Model M386.1) with the mercury arc maintained at a distance of one and three-eighths inches, the arc moving at a rate of 75 inches per minute. The "screened" exposure was obtained by employing a ¼-inch-deep honey-combed screen over the lamp to partially collimate the light.

A sample of the exposed element was cut off and sealed, felt side down, to the bottom of a Büchner funnel. The element was heated with an infrared heating lamp and vacuum was then applied to the Büchner funnel by a running water aspirator causing the heated thermoplastic material in the underexposed areas to flow into the porous support, leaving a thermoplastic relief image in the coated stratum. The polyethylene terephthalate cover sheet conformed to this relief image so that a reverse 3-dimensional image was formed in this removable cover sheet. This cover sheet had to be removed, of course, before the image could be used as a printing relief. Another sample of the exposed element was treated in the same manner except that the cover sheet in which the 3-dimensional image was formed was maintained in contact with the photopolymerized relief stratum while molten wax was poured over the cover sheet and allowed to cool. The cover sheet, thus made more rigid by the application of the wax, was removed and used as a mold to form a plaster of paris replica of the relief image in the photopolymerized stratum. Another sheet of 0.001 inch-thick polyethylene terephthalate film was placed over the photopolymerized relief image (still in the Büchner funnel), heat and a gaseous pressure gradient were applied as before, and a second, reverse, 3-dimensional image was formed in the film. This 3-dimensional image underwent no noticeable change in appearance after several months of storage at room temperature. Another reverse 3-dimensional image was formed in a similar manner in a sheet of 0.01 inch-thick polyethylene. Thus a method was demonstrated for producing decorative effects in plastic films. A thermoplastic cover sheet could be employed which is normally fairly rigid at room temperature but is made fairly flexible at elevated temperatures. Such a sheet could be preheated before and during use as a cover sheet to render it sufficiently flexible to permit the relief image to be formed therein and once formed the sheet could be cooled to rigidify it thereby preserving the replica image.

Similar, but slightly less satisfactory development of the photopolymer relief image was obtained when the polyethylene terephthalate cover sheet was removed from a sample of the exposed element prior to the steps of heating and applying vacuum.

Most convenient operation was achieved when the polyethylene terephthalate cover sheet was removed from a sample of the exposed element and replaced with a thin translucent rubber sheet (rubber dam) during the application of heat and vacuum.

Heat and vacuum can be applied in either order so long as the photopolymerizable stratum remains at the operating temperature during the application of the pressure gradient.

The relief images produced by the above process were inked and good prints were made from them.

EXAMPLE II

A coating was made similar to that described in Example I except that the coating solution was applied twice so as to give a double layer, about 0.018 inch in thickness when dry. This coating was laminated to a piece of black felt prepared as described in Example I, with the lamination occurring at about 80° C. Exposure was similar to that described in Example I except that a step wedge was obtained by exposing different areas of the element to 2, 4, 8, 16 and 32 screened passes respectively. The polyethylene terephthalate cover sheet was stripped off, the element placed in a vacuum frame, a thin, translucent rubber sheet was sealed over the top of the element, and the element was heated with an infrared lamp. With the application of vacuum to the heated element as in Example I, the thermoplastic material flowed into the porous support leaving a relief image which varied in relief-depth according to the degree of exposure as follows:

| Exposure, screened passes: | Relief height in inches |
|---|---|
| 2 | 0.002 |
| 4 | 0.008 |
| 8 | 0.015 |
| 16 | 0.016 |
| 32 | 0.017 |

This dependence of relief height upon exposure is believed due to a gradation of degree of polymerization with distance into the coating.

EXAMPLE III

The photopolymerizable coating of Example I (on a polyethylene terephthalate film support) was laminated, by pressing at about 80° C., to an unglazed porous porcelain plate, ⅜-inch in thickness, of the type customarily used in chemical laboratories for drying crystals, precipitates, etc. Prior to the lamination, the clay plate was made infrared absorbent by painting its surface with an acetone solution containing 15% of the cellulose acetate butyrate polymeric binder described in Example I and also containing 0.5% of the infrared absorbing dye prepared as described in Example I of Brooker, U.S. Patent 2,094,580. The dull green crystals of this dye had a melting point of 179–181° C. and had an absorption peak in ethanol solution of 770 millimicrons. The laminated element was exposed and then heated with simultaneous application of a pressure gradient (using a thin rubber sheet over the coating), all as described in Example I. A good relief image was obtained.

EXAMPLE IV

By pressing at about 80° C., the photopolymerizable coating of Example I was laminated to a porous metal filter disc which was then mounted as a Buchner funnel so that vacuum could be applied from one side. This porous metal disc was ⅛-inch in thickness and had an average pore size of 0.35 micron and a throughput of ethylene glycol at 187° C. of 47 lb. per hour over a surface area of one square foot and a pressure gradient of one pound per square inch. The laminated element was exposed through a photographic negative for 40 minutes, under vacuum (to reduce the effects of oxygen inhibition of the photopolymerization reaction), using a 400 watt mercury arc at a distance of 6.0 inches. The element was then heated over a hot plate (with the photopolymerizable stratum toward the heating surface) until the porous metal reached a temperature of about 120° C. and, with the subsequent application of a pressure gradient as in Example III, a good relief image was obtained.

EXAMPLE V

A laminated element, prepared as in Example I except for omission of the treatment of the felt with the carbon black dispersion, was exposed as in Example I. The element was then placed in a pressure cylinder (or "bomb") and heated with superheated steam to a temperature of 150° C. while nitrogen gas was forced into the cylinder until the pressure reached two atmospheres. The element was so positioned in the cylinder that the two-atmosphere pressure impinged on the coated side while the back (uncoated side) of the felt was open to the normal, outside atmosphere. The one-atmosphere pressure gradient thus produced resulted in the flow of the heated thermoplastic material in the underexposed areas into the porous support, leaving a good relief image.

A similar element was reversed in the pressure cylinder, i.e., felt side toward the higher pressure, and a second piece of felt was placed between the face of the exposed photopolymer surface and the cylinder wall. After heating, the pressure was again applied and the unexposed material forced into the second piece of felt to give a relief image. Another element of this sort was mounted similarly, except that the second piece of felt was omitted. The unexposed material consisting of a small circular area was then simply blown out into the free volume on the atmospheric pressure side to leave a small hole. The element was then used to provide an air leak into a controlled-pressure evacuated apparatus.

EXAMPLE VI

A coating solution was prepared from 100 g. of a 15% solution in acetone of a vinyl chloride-vinyl acetate copolymer, 15 g. of polyethylene glycol diacrylate (as described in Example I) and 0.15 g. of 2-ethyl-9,10-anthraquinone. The copolymer contained 88.5–91.5% vinyl chloride and 8.5–11.5% vinyl acetate units, had a specific gravity of 1.36 and a specific viscosity of 0.875–0.925 (measured in a 1% solution in methyl isobutyl ketone at 20° C).

This composition was coated on a polyethylene terephthalate film support and laminated to felt which had been treated by painting with a carbon block dispersion, according to the preferred treatment of Example I. With continuation of the preferred treatment of Example I (using the thin translucent rubber sheet during heating and application of the pressure gradient), a good relief image was obtained.

EXAMPLE VII

Example VI was essentially repeated except that the felt was made infrared-absorbent by painting with an acetone solution containing 0.5% of an infrared dye and 15% of the cellulose acetate butyrate polymeric binder described in Example I. The dye, a blue solid, with absorption peak at 706 millimicrons, was prepared according to the procedure of Adams and Haller for synthesis of "cryptocyanines," J. Am. Chem. Soc., 42, 2661–3 (1920). A good relief image was obtained.

EXAMPLE VIII

Example VII was essentially repeated except that the felt was replaced with wire screen supporting a piece of filter paper treated with the solution of infrared absorbing dye described in Example VII. The wire screen was a U.S. standard sieve, ASTM Specification 325 mesh Tyler-equivalent, having 44 micron openings. The filter paper was No. 9–795, semi-crimped, rapid, manufactured by Fisher Scientific Co. A good relief image was obtained.

EXAMPLE IX

A coating solution was prepared from 200 g. of a 15% solution in acetone of polyisobutyl methacrylate, 30 g. of the polyethylene glycol diacrylate described in Example I and 0.25 g. of 2-ethyl-9,10-ethyl anthraquinone. The polyisobutyl methacrylate had a viscosity of 40–70 sec. in a 38% solution in toluene, a density of 1.05 g./cc. and a refractive index of 1.477 (all measurements being made at 25° C.).

This composition was coated as in Example I, then laminated to infrared absorbent felt as in Example VII except that the infrared absorbing dye was of the formula:

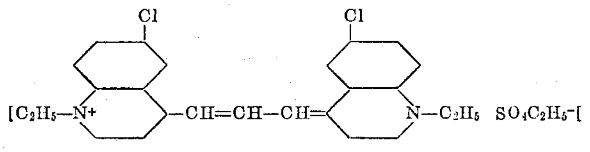

The solid dye was in the form of brilliant green sparkling crystals, had an absorption peak at a wave length greater than 700 millimicrons and was prepared in a similar manner as the dye in Example VII except for the use of 6-chlorolepidine in place of the unsubstituted lepidine and the use of ethyl sulfate in place of ethyl iodide.

The laminated element was exposed, heated and subjected to a pressure gradient as in Example VII to produce a good relief image.

EXAMPLE X

A coating solution was prepared from 120 g. of a 30% solution of a copolyester in methyl ethyl ketone, 36 g. of pentaerythritol triacrylate and 1.0 g. of benzoin methyl ether. The copolyester was the condensation product of terephthalic, isophthalic and sebacic acids, in the proportion of 33:17:50, respectively, and ethylene glycol. The 30% methyl ethyl ketone solution of the copolyester had a viscosity of 200–320 centipoises at 25° C.

The solution was coated on a polyethylene terephthalate film support as in Example I so as to prepare two coated sheets. One of the coated sheets was laminated to filter paper as in Example VIII (but without the wire screen support) while the other sheet was laminated in a similar manner to nainsook cloth. The nainsook had a thickness of 0.0056 inch, a fabric weight of 2.16 ounces per square yard, and a porosity (void fraction) of 0.659.

Both of the laminated elements were exposed as in Example I, then heated on a hot plate until the underexposed, unpolymerized areas became flowable, and subjected to a pressure gradient as in Example I. Relief images similar to those of Example I were obtained in both elements but the thicker porous support of Example I permitted easier handling.

EXAMPLE XI

A coating solution of a photohardenable (as distinguished from photopolymerizable) composition was prepared from 0.8 g. of polyvinyl benzophenone, 0.8 g. of benzyl alcohol and 5 ml. of $CH_2Cl_2$. The polyvinyl benzophenone was prepared as described in Example I of Merrill et al., U.S. Patent 2,831,768, issued April 22, 1958.

The solution was coated, and the coating was dried, laminated to infrared absorbent felt, exposed in a vacuum printing frame, heated with an infrared lamp and subjected to a pressure gradient, all essentially as described in Example I, except that exposure of 32 screened passes was required, to give a similar relief image. In this Example, photohardening has been obtained by a cross-linking reaction rather than by photopolymerization. The cross-linking reaction is believed to be bimolecular reduction resulting in a pinacol structure, according to the following equation:

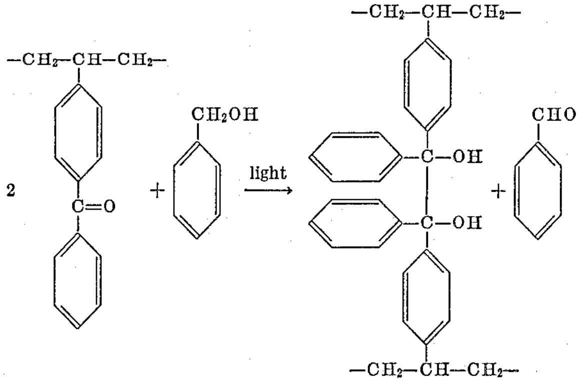

EXAMPLE XII

The coating of Example I was laminated to a piece of infrared absorbing felt as described in Example VII. The laminated element was exposed as in Example I except that exposure in this instance was through an essentially "continuous tone" negative, i.e., a negative which had ten distinct optical density steps from white to black. The best relief image was obtained with an exposure of three screened passes. The following series of relief heights was calculated by subtracting the background (felt) thickness from the total (felt+relief) thickness. In this series, the relief height #1 represents that area which received the greatest exposure (i.e., that area which was exposed through the white or clear area of the negative) while relief height #10 represents that area exposed through the highest density area of the negative:

| | Relief height (in microns) |
|---|---|
| 1 | 22.3 |
| 2 | 20.3 |
| 3 | 17.0 |
| 4 | 11.5 |
| 5 | 5.6 |
| 6 | 2.5 |
| 7 | 0 |
| 8 | 0 |
| 9 | 0 |
| 10 | 0 |

This is further evidence of the dependence of relief height upon exposure, whether the exposure is a function of time as described in Example II or a function of intensity as in the present example.

EXAMPLE XIII

The photopolymerizable coating of Example I was placed in a laminating press in contact with a piece of felt as used in Example I, except that it had not been treated with carbon black or other infrared absorbing material. The temperature of coating was raised to about 90° C. (approximately 10° C. higher than the temperature of lamination in Example I) and considerable pressure was applied in the press. Instead of achieving the usual lamination, the thermoplastic photopolymerizable coating was entirely forced into the porous felt. The element was then exposed, placed in a "Büchner funnel connected to a vacuum system as in Example I, and heated with the infrared lamp used in that example. About five minutes heating was required before the underexposed material began to flow appreciably under the pressure gradient.

This was aproximately three times the heating period required in Example I wherein the felt support contained an infrared-absorbing material. The element was subjected to the simultaneous treatment of heat and pressure gradient until the underexposed material was forced out of the felt and through the funnel leaving an image within the felt. Printing ink was doctored onto the surface of the element which had received the exposure so that the ink penetrated only the underexposed areas from which underexposed polymerizable material had been removed. The inked element was then pressed against a sheet of paper so as to print a copy of the original image on paper. Successive copies could be obtained from the inked element without reinking.

This same technique was used for making an element useful in the silk screen process. A coating was made as in Example I on a 0.001 inch polyethylene terephthalate support with a dry thickness of 0.002 inch. This was then heated and pressed into a silk cloth (100 threads per inch) and exposed through a positive transparency as in Example I. The support was then removed from the exposed element and it was mounted in a vacuum frame over a piece of blackened felt, prepared as in Example I. The element was then heated with infra-red radiation during the application of vacuum to develop the image. Finally, the element was removed from the blackened felt, mounted in a rigid framework, and used as a silk screen stencil for the preparation of prints corresponding to the positive transparency used.

EXAMPLE XIV

A solution was prepared containing the following components:

| | |
|---|---|
| Polyethylene glycol diacrylate (as described in Example I) ---g-- | 24 |
| p-Methoxyphenol ---mg-- | 24 |
| Phenanthrenequinone ---mg-- | 93 |

A piece of felt as described in Example I (without the treatment with the carbon black dispersion) was impregnated with the above solution and the felt was sandwiched between two sheets of 0.001 inch-thick polyethylene terephthalate film. The resulting element was exposed as in Example I except that a vacuum printing frame was not used. After exposure, both of the polyethylene terephthalate sheets were removed and the element was treated with vacuum as disclosed in Example XIII. However, the heating step of that example was omitted since the underexposed areas of the syrupy composition were flowable under vacuum at room temperature. An image was thus obtained within the felt so that the element served as a printing plate. Printing ink was doctored onto the element so that the ink penetrated into the felt only in the underexposed areas from which the photopolymerizable composition had been removed. The linked element was pressed against a sheet of paper so as to print a copy of the original image onto the paper. The element retained enough ink in the underexposed areas that it could be used to make several additional prints without the necessity of reinking.

Another element was prepared in the same manner through the steps of exposing and removing the polyethylene terephthalate sheets from the felt. Printing ink was then forced through the underexposed areas of the felt (thus removing the underexposed polymerizable material from the felt) by successively applying ink from a roller to one surface of the felt and forcing ink through the felt by the pressure of the roller. In this case, the fluid pressure gradient across the element was hydraulic rather than gaseous. Sufficient ink remained in the underexposed areas of the felt that the element could be used in making several copies of the original image by printing onto paper.

When exposure of the photopolymerizable element is made through a continuous-tone transparency, variation in relief height, corresponding with variation in exposure, may be obtained. It is believed that the attenuation of radiation by the photoinitiator results in a polymerization gradient through the thickness of the photopolymer layer, with highest degree of polymerization or conversion of monomer toward the side from which the radiation entered the element and the lowest degree of monomer conversion near the porous support. At the temperature used in developing the plate, there will be a corresponding viscosity gradient throughout the film thickness. A critical viscosity may be conceived at which the exposed polymer penetrates the porous support at a very slow rate (at the temperature of development) compared with the time scale of the development process. The depth corresponding to this critical viscosity will then move downward as exposure is increased. Thus, thermoplastic material flows into the porous support, under a gaseous pressure gradient, to form a relief image which reproduces the continuous tone of the original transparency.

The attenuation of light may be increased by adding a dye that absorbs the actinic light, thus lowering the contrast of the system. The same effect may be obtained by increasing the photoinitiator concentration. Likewise, the contrast may be raised (at the sacrifice of photographic speed of the system) by lowering the photoinitiator concentration. Such a technique is quite suitable for making relief maps, cameos, or ornamental plaques, molding patterns, patterns for pantograph machining or the like.

Photohardenable compositions include both photocrosslinkable and photopolymerizable systems. In photocrosslinkable compositions, the interaction of one photon with the system usually results in the formation of a maximum of one crosslink. Photocrosslinking reactions suitable for use in this invention include a number of reactions well known in the art, for example, the reaction resulting from irradiation of fusible layers containing polyvinyl cinnamate or polyvinyl benzophenone (as in Example XI), the reaction resulting from the irradiation of polymers containing hydroxyl groups, e.g., partially hydrolyzed polyvinyl acetate in the presence of chromic acid or dichromates, and the photodecomposition of certain mono- or bifunctional diazo, azido or diazonium compounds. The addition of an inert plasticizer may be desirable in these cases to obtain a flow temperature that is low enough to be practical. The photohardenable strata of the present invention also include certain gelatin layers, e.g., layers of bichromated gelatin which are differentially hardenable by the action of light. In this case some moisture is required to cause the unexposed, unhardened gelatin to flow into the porous support under the application of heat and a pressure differential. Treating the exposed element with steam is a simple method of providing both the heat and the moisture. Obviously, gelatino-silver halide emulsions coated on a suitable porous support could also be used by exposing, developing in a hardening developer, and applying heat and moisture, (e.g., steam) along with a pressure differential to cause gelatin in the unexposed areas to flow into the porous support to form a relief image.

Although this invention covers broadly the use of photohardenable compositions, including the photocrosslinkable systems mentioned above, it is preferred to use those compositions which are hardenable via a photopolymerization process. Such compositions have the advantage that a single photon results in the formation of a large number of new chemical bonds through polymerization, thus giving elements which are generally of much higher photographic speed than those listed in the preceding paragraph. In addition, the monomer used often serves as a plasticizer for the unexposed material and so convenient operating temperatures are readily obtained, although inert plasticizers may be used if desired to adjust operating temperature. In addition, photopolymerizable compositions are readily formulated from commercial materials, and they are relatively inexpensive.

Photopolymerizable compositions useful in this invention are described in the patents and applications listed above. These compositions usually comprise polymeric binders, addition-polymerizable ethylenically unsaturated compounds, addition-polymerization initiators and, if desired, thermal, addition-polymerization inhibitors.

Suitable binders include the thermoplastic polymers disclosed in Burg and Cohen, U.S. Patent 3,060,023. In that same patent are also disclosed suitable fillers or reinforcing agents which are useful, for example, in improving the strength of the composition. Such materials must be either fusible or used in sufficiently small quantities so as to avoid interference with the flow of heated, underexposed areas of the photopolymerizable stratum into the porous support. Also, all materials present in the photopolymerizable stratum must, prior to exposure, be of sufficiently small particle size as to be penetrable into the porous support which has an average pore size of about 0.0001 to 0.001 inch. Some materials, e.g., the acrylate and methacrylate esters of poly (vinyl acetate co vinyl alcohol), are capable of service simultaneously as both the polymeric binder and as the ethylenically unsaturated, addition polymerizable compound (i.e., an unsaturated polymer, capable of further polymerization).

Suitable addition-polymerizable ethylenically unsaturated compounds, in addition to the preferred triethylene glycol diacrylate and polyethylene glycol diacrylates with an average molecular weight of the diol precursor of 200 to 600, include vinyl monomers, particularly those described in U.S. Patent 2,791,504, column 17, line 62, to column 18, line 16, acrylic or methacrylic acid esters of diethylene glycol, triethylene glycol and higher polyalkylene glycols, e.g., methoxytriethylene glycol acrylate, ethylene glycol dimethacrylate, diethylene glycol diacrylate, methoxytriethylene glycol methacrylate, di- and triethylene glycol acrylates, and methacrylates, the acrylates, diacrylates, methacrylates and dimethacrylates of tetraethylene glycol, dipropylene glycol, and polybutylene glycols. Still other useful compounds include the diacrylates and dimethacrylates of ether-glycols which also contain a combined intrachain dibasic acid unit, e.g., the diacrylate or dimethacrylate of $$HOCH_2CH_2OCH_2CH_2O{-}OCRCOOCH_2CH_2OCH_2CH_2OH$$

where R is a divalent hydrocarbon radical, e.g., methylene or ethylene. Other useful vinyl monomers include acrylate and methacrylate esters of polyhydroxy compounds, e.g., glycerol, pentaerythritol, 1,2,4-butanetriol, 1,4→3,6-dianhydro-D-glucitol, glucose, mannose, sucrose, inositol, sorbitol and mannitol. A particularly useful class of addition-polymerizable compounds are the pentaerythritol esters disclosed in assignee's copending application, Celeste and Seide, U.S. Ser. No. 274,909, now Patent No. 3,261,689 filed Apr. 23, 1963.

An addition polymerization initiator activatable by actinic radiation may be added in amounts of from 0.001 to 10 parts by weight, preferably 0.001 to 0.2 part by weight per 100 parts by weight of the total composition. Examples of such initiators are vicinal ketaldonyl compounds such as diacetyl, benzil, etc., α-ketaldonyl alcohols such as benzoin, pivaloin, etc., acyloin ethers such as benzoin methyl or ethyl ethers, α-hydrocarbon substituted aromatic acyloins including α-methylbenzoin, α-allylbenzoin and α-phenylbenzoin. In addition, o-alkyl xanthate esters (U.S. Patent 2,716,633) are useful. Particularly preferred are the anthraquinone photoinitiators. In addition to anthraquinone other suitable initiators include 1-chloroanthraquinone, 2-chloroanthraquinone, 2-methylanthraquinone, 2-ethylanthraquinone, 2-tert-butylanthraquinone, octamethylanthraquinone, 9,10 - phenanthrenequinone, 1,4 - naphthoquinone, 1,2 - benzanthraquinone, 2,3 - benzanthraquinone, 2-methyl-1,4-naphthoquinone, 2,3-dichloro-naphthoquinone, 1,4 - dimethylanthraquinone, 2,3-dimethylanthraquinone, 2-phenylanthraquinone, salt of anthraquinone alpha-sulfonic acid, 3-chloro-2-methylanthraquinone, retenequinone, 7,8,9,10-tetrahydronaphthacenequinone, and 1,2,3,4 - tetrahydrobenz (a) anthracene-7,12-dione.

A thermal addition polymerization inhibitor may be present in the preferred compositions. Suitable thermal polymerization inhibitors that can be used include p-methoxy-phenol, hydroquinone and alkyl and aryl-substituted hydroquinones, tert-butyl catechol, pyrogallol, copper resinate, naphthylamines, betanaphthol, cuprous chloride, 2,6-di-tert-butyl-p-cresol, phenothiazine, nitrobenzene and dinitrobenzene. Other useful inhibitors include p-toluquinone and chloranil.

The porous support advantageously contains dyes or pigments which give protection against halation. With transparent or translucent supports, the anti-halation material may be on the rear surface of the support. When anti-halation material is used it preferably should be sufficiently absorptive of actinic radiation to permit reflectance from the support of no more than 35% of incident actinic radiation. When it is intended that the heating step in the present process be effected by infrared radiation, it has also been found very advantageous to include infrared absorbing materials within the porous support, especially such materials which also protect against halation. Carbon black is an excellent dual-purpose compound for incorporating within the porous support to absorb infrared radiation and to protect against halation.

Various dyes, pigments and color forming components can be added to the photopolymerizable compositions to give varied results after the formation of the thermoplastic image. These added materials preferably should not absorb excessive amounts of light at the exposure wave length or inhibit the polymerization reaction.

The exposure to actinic radiation can be accomplished by using a point or a broad actinic radiation source. The radiation source should furnish an effective amount of radiation at wave lengths at which the photoinitiator is active. This is ordinarily in the visible and ultraviolet region of the electromagnetic spectum. Suitable sources include carbon arcs, mercury-vapor arcs, fluorescent lamps with special ultraviolet- or visible-radiation-emitting phosphors, argon glow lamps, and photographic flood lamps. The point radiation sources are generally used at a distance of 20 up to about 40 inches from the photopolymerizable element. Broad radiation sources can be used at a distance up to 24 inches from the photopolymerizable surface. The distance may vary depending on the strength of the radiation source and the time required for exposure.

In the process of this invention, the step of heating the element to the operating temperature can be carried out by any convenient means well known to the art including the use of rollers, flat or curved heating surfaces or platens, radiant sources, e.g., heating lamps, etc. The heat can be applied at any stage of the process prior to the application of the gaseous pressure gradient provided the temperature of the thermoplastic stratum remains at the operating temperature during the application of the pressure gradient. In a preferred embodiment, the heat is applied simultaneously with the pressure gradient and in this embodiment, it is convenient to supply radiant energy (infrared) which can be absorbed and converted to heat within the image-forming element.

The printing reliefs made in accordance with this invention can be used in most classes of printing but are particularly applicable to those classes of printing wherein a distinct difference of height between printing and non-printing areas is required. These classes include those wherein the ink is carried by the raised portion of the relief such as in dry-offset printing and ordinary letterpress printing, the latter requiring greater height differences between printing and non-printing areas. The plates are useful for multicolor printing.

These compositions can be used in making continuous tone reproductions, resulting in relief maps, cameos, decorative art objects, and novel printing from ordinary continuous tone photographic negatives wherein the image may be colored by coloration of the photopolymerizable composition (using any dye that does not strongly absorb the actinic radiation). Further novel effects could be achieved by filling in the "valleys" of a relief image (which could have been previously colored) with a transparent or translucent material, e.g., dyed molten wax or thermoplastic polymer. The process is suitable for line work, block printing, etc. For halftone work, intaglio, etc., the process is most useful when the required resolution is rather low, e.g., when the required space between lines or halftones to be reproduced is at least as great as the thickness of the coating. Thus, this process is suitable for reproduction of line, letter and block originals and large seals, halftone and intaglio prints, e.g., for billboards.

The process could also be used in gravure printing by placing a metal grid over a porous support and filling the open spaces within the grid with a photopolymerizable material. The photopolymerizable material may be exposed to a continuous tone transparency and then developed according to the process of this invention by applying heat and fluid pressure gradient so as to produce varying well depths within the grid.

Also the relief images produced by the process of this invention can be used in producing decorative effects in plastic films. Any number of 3-dimensional replicas of a photohardened relief image can be formed by application of heat and a pressure gradient to successive sheets of thermoplastic films in contact with said photohardened relief image. This application of the pressure gradient is facilitated by the porosity of the support for the photohardened relief image, i.e., the porosity of the support has utility beyond that involved in the original formation of a relief image in the photohardenable stratum.

The term "underexposed" as used herein is intended to cover the image areas which are completely unexposed or exposed only to the extent that there is addition polymerizable compound still present in sufficient quantity that the softening temperature remains substantially lower than that of the complementary exposed image areas. The term "flow" temperature, as applied to either an underexposed or exposed area of a photopolymerizable stratum, means the minimum temperature at which the area in question transfers and penetrates to a depth of 0.005 inch, within 15 seconds, under slight pressure, e.g., 1–5 lbs./in.$^2$, into a piece of felt-like cotton filter cloth (having an average pore size of about 0.001 inch). The term "operating temperature" means the temperature at which the flow of the underexposed areas from the photopolymerizable stratum is actually produced under the pressure gradient. The operating temperature is intermediate between the "flow" temperatures of the underexposed and exposed areas of a photopolymerizable stratum.

This process has the advantages that it is dry, i.e., no wet processing solutions are required, and the washout equipment previously used can be replaced with a simple apparatus for supplying a pressure gradient and a source of heat. The simple development technique is easily adaptable to continuous preparation of a printing plate in which a moving web of the element is first exposed and then developed. Processing is inherently more rapid than in the case of washed-out plates and, therefore, continuous processing on a production scale is more feasible than in wash-out systems. An additional important advantage is that any suitable thermoplastic binder can be used rather than specific binders which are water soluble or solvent soluble. For many purposes, such as to secure good physical hardness, one would previously have had to synthesize expensive polymers that also have the required solubility, whereas a wide range of commercially available inexpensive binders can be used in the present invention.

All the relief images prepared according to the above examples (except for continuous tone images) could be used in actual printing operations, in flat bed or rotary presses.

We claim:

1. A process for preparing a three-dimensional image from a layer of a photohardenable thermoplastic stratum in integral contact with a porous support, which process comprises: (1) exposing said photohardenable stratum imagewise to actinic radiation, (2) maintaining said stratum at an operating temperature intermediate between the flow temperatures of the exposed and the underexposed portions of said stratum, and (3) applying a gaseous pressure gradient across the element to move said underexposed portions through said porous support thereby producing a relief image on said stratum corresponding to the hardened imagewise exposed area.

2. A process for preparing a relief printing plate from a layer of a photohardenable thermoplastic stratum, solid at room temperature, liminated to a layer of porous material, which process comprises: (1) exposing said photohardenable stratum imagewise to actinic radiation, (2) heating said stratum to an operating temperature intermediate between the flow temperatures of the exposed and the underexposed portions of said stratum, and (3) applying a gaseous pressure gradient across said laminated layers forcing said heated underexposed portions of said stratum to flow into said layer of porous material thereby producing a relief image on the surface of said stratum corresponding to the pattern of imagewise exposure.

3. A process as defined in claim 2 wherein said photohardenable stratum comprises a stratum of photopolymerizable material the underexposed portions of which have a flow temperature between about 40° C. and about 260° C.

4. A process as defined in claim 2 wherein steps (2) and (3) are performed simultaneously.

5. A process as defined in claim 2 wherein the imagewise exposing step (1) is conducted by directing said actinic radiation through a continuous tone transparency.

6. A process as defined in claim 2 wherein the laminated porous material contains carbon black or an infrared absorbing material with an absorption peak greater than 700 millimicrons and the heating step (2) is effected by infrared radiations.

7. A process as defined in claim 6 wherein steps (2) and (3) are carried out simultaneously.

8. A process as defined in claim 2 wherein a flexible cover sheet is placed over the outer surface of said layer of thermoplastic stratum prior to step (3).

9. A process as defined in claim 8 wherein said gaseous pressure gradient is maintained for a sufficient length of time to form a reverse image of said relief image in said cover sheet and said cover sheet is rigidified thereby preserving said reverse image.

10. A process for preparing a printing element from a layer of porous material which contains within its open spaces a thermoplastic photohardenable material, which process comprises: (1) exposing said photohardenable stratum imagewise to actinic radiation, (2) heating said material to an operating temperature between the flow temperature of the exposed and the underexposed portions of said material; and (3) applying a gaseous pressure gradient across said layer to remove said underexposed portions thereby producing permeable openspaces within said layer in an image pattern corresponding to the pattern of the nonexposed areas.

11. A process as defined in claim 10 wherein said thermoplastic material is a photopolymerizable material the underexposed portions of which have a flow temperature between about 40° C. and about 260° C.

12. A process as defined in claim 10 wherein steps (2) and (3) are performed simultaneously.

References Cited

UNITED STATES PATENTS

| | | | |
|---|---|---|---|
| 3,260,612 | 7/1966 | Dulmage et al. | 250—65.1 X |
| 2,544,905 | 3/1951 | Van Deusen | 96—36 |
| 2,670,287 | 2/1954 | Minsk et al. | 96—115 |
| 2,760,863 | 8/1956 | Plambeck | 96—115 X |
| 2,997,391 | 8/1961 | Murray et al. | 96—115 X |
| 3,042,573 | 7/1962 | Roberts | 156—285 |
| 3,060,023 | 10/1962 | Burg et al. | 96—28 |
| 3,192,194 | 6/1965 | Burg et al. | 96—115 X |
| 3,194,661 | 7/1965 | Cohen | 96—115 X |

FOREIGN PATENTS

| | | |
|---|---|---|
| 538,011 | 3/1957 | Canada. |

NORMAN G. TORCHIN, *Primary Examiner.*

C. BOWERS, *Assistant Examiner.*